United States Patent
Yang et al.

(10) Patent No.: US 9,391,134 B2
(45) Date of Patent: Jul. 12, 2016

(54) FIN FIELD EFFECT TRANSISTOR, SEMICONDUCTOR DEVICE INCLUDING THE SAME AND METHOD OF FORMING THE SEMICONDUCTOR DEVICE

(71) Applicant: Samsung Electronics Co., Ltd., Suwon-si (KR)

(72) Inventors: Chang-Jae Yang, Seoul (KR); Sang-Su Kim, Yongin-si (KR); Jae-Hwan Lee, Seoul (KR); Jung-Dal Choi, Hwaseong-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/336,084

(22) Filed: Jul. 21, 2014

(65) Prior Publication Data

US 2015/0035009 A1 Feb. 5, 2015

(30) Foreign Application Priority Data

Jul. 31, 2013 (KR) .................. 10-2013-0091030

(51) Int. Cl.
| | |
|---|---|
| H01L 29/06 | (2006.01) |
| H01L 21/8238 | (2006.01) |
| H01L 21/84 | (2006.01) |
| H01L 27/092 | (2006.01) |
| H01L 27/12 | (2006.01) |

(52) U.S. Cl.
CPC ........ *H01L 29/06* (2013.01); *H01L 21/823821* (2013.01); *H01L 21/845* (2013.01); *H01L 27/0924* (2013.01); *H01L 27/1211* (2013.01)

(58) Field of Classification Search
None
See application file for complete search history.

(56) References Cited

U.S. PATENT DOCUMENTS

| | | |
|---|---|---|
| 5,906,708 A | 5/1999 | Robinson et al. |
| 7,638,842 B2 | 12/2009 | Currie et al. |
| 7,662,689 B2 | 2/2010 | Boyanov et al. |
| 7,777,250 B2 | 8/2010 | Lochtefeld |
| 7,799,592 B2 | 9/2010 | Lochtefeld |
| 7,842,982 B2 | 11/2010 | Moriyama et al. |
| 7,888,197 B2 | 2/2011 | Chidambarrao et al. |
| 7,993,998 B2 | 8/2011 | Chen et al. |

(Continued)

FOREIGN PATENT DOCUMENTS

JP  2007-258485 A  10/2007

OTHER PUBLICATIONS

Feng Wang, et al. / Highly Selective Chemical Etching of Si vs. Si1-xGex Using NH4OH Solution / J.Electrochem. Soc., vol. 144, No. 3, Mar. 1997, L37-L39.

(Continued)

*Primary Examiner* — Fernando L Toledo
*Assistant Examiner* — Lawrence-Linh T Nguyen
(74) *Attorney, Agent, or Firm* — Muir Patent Law, PLLC

(57) ABSTRACT

A fin field effect transistor includes a first fin structure and a second fin structures both protruding from a substrate, first and second gate electrodes on the first and second fin structures, respectively, and a gate dielectric layer between each of the first and second fin structures and the first and second gate electrodes, respectively. Each of the first and second fin structures includes a buffer pattern on the substrate, a channel pattern on the buffer pattern, and an etch stop pattern provided between the channel pattern and the substrate. The etch stop pattern includes a material having an etch resistivity greater than that of the buffer pattern.

20 Claims, 15 Drawing Sheets

(56) References Cited

U.S. PATENT DOCUMENTS

| | | |
|---|---|---|
| 8,242,568 B2 | 8/2012 | Ikeda et al. |
| 8,274,097 B2 | 9/2012 | Cheng |
| 8,324,660 B2 | 12/2012 | Lochtefeld et al. |
| 8,367,498 B2 | 2/2013 | Chang et al. |
| 2007/0221956 A1* | 9/2007 | Inaba ............... H01L 21/823807 257/197 |
| 2008/0191247 A1* | 8/2008 | Yin .................... H01L 21/8221 257/204 |
| 2012/0098067 A1 | 4/2012 | Yin et al. |
| 2012/0104472 A1 | 5/2012 | Xu et al. |
| 2014/0361378 A1* | 12/2014 | Lee .................... H01L 27/0928 257/369 |

OTHER PUBLICATIONS

Minjoo L. Lee, et al. / Strained Si, SiGe, and Ge channels for high-mobility metal-oxide-semiconductor filed-effect transistors / J. of Applied Physics 97, 011101 (2005) / 011101-1~011101-27.

* cited by examiner

FIN FIELD EFFECT TRANSISTOR, SEMICONDUCTOR DEVICE INCLUDING THE SAME AND METHOD OF FORMING THE SEMICONDUCTOR DEVICE

CROSS-REFERENCE TO RELATED APPLICATION

This U.S. non-provisional patent application claims priority under 35 U.S.C. §119 to Korean Patent Application No. 10-2013-0091030, filed on Jul. 31, 2013, in the Korean Intellectual Property Office, the disclosure of which is hereby incorporated by reference in its entirety.

BACKGROUND

The present disclosure relates to a semiconductor device and, more particularly, to a fin field effect transistor, a semiconductor device including the same, and a method of forming the semiconductor device.

Semiconductor devices are widely used in the electronic industry because of their small size, multi-function, and/or low manufacture costs. Semiconductor devices may be categorized as any one of semiconductor memory devices storing logic data, semiconductor logic devices processing operations of logical data, and hybrid semiconductor devices having both the function of the semiconductor memory devices and the function of the semiconductor logic devices. Semiconductor devices having excellent characteristics have been increasingly demanded with the development of the electronic industry. For example, high reliable, high speed and/or multi-functional semiconductor devices have been increasingly demanded. In order to satisfying the demands, structures of semiconductor devices have been complex and semiconductor devices have been highly integrated.

SUMMARY

Embodiments of the disclosure may provide semiconductor devices capable of improving mobility characteristics.

Embodiments of the disclosure may also provide methods of forming a semiconductor device capable of reducing dispersion of device characteristics.

According to some embodiments, a fin field effect transistor includes: a first fin structure and a second fin structure, each of the first and second fin structures protruding from a substrate; a first gate electrode on the first fin structure, and a second gate electrode on the second fin structure; and a gate dielectric layer between each of the first and second fin structures and the first and second gate electrodes, respectively. Each of the first and second fin structures may include: a buffer pattern on the substrate; a channel pattern on the buffer pattern; and an etch stop pattern provided between the channel pattern and the substrate. The etch stop pattern may include a material having an etch resistivity greater than that of the buffer pattern.

In some embodiments, the etch stop pattern includes a semiconductor material.

In some embodiments, the channel pattern includes a plurality of channel components, and the etch stop pattern may extend between the plurality of channel components when viewed from a plan view.

In some embodiments, the buffer pattern includes a first buffer pattern and a second buffer pattern that are sequentially stacked on the substrate, and the etch stop pattern may be disposed between the first buffer pattern and the second buffer pattern.

In some embodiments, the etch stop pattern is disposed between the first buffer pattern and the channel pattern.

In some embodiments, the etch stop pattern is disposed between the second buffer pattern and the substrate.

According to other embodiments, a semiconductor device includes: a first transistor and a second transistor respectively disposed on a first region and a second region of a substrate. Each of the first and second transistors may include a fin structure. Each of the fin structures of the first and second transistors may include: a buffer component on the substrate; a channel component on the buffer component; and an etch stop component between the channel component and the substrate. The channel component of the first transistor may include a different material from the channel component of the second transistor.

In some embodiments, a lattice constant of the buffer component of the first transistor is greater than a lattice constant of the channel component of the first transistor, and a lattice constant of the buffer component of the second transistor is smaller than a lattice constant of the channel component of the second transistor.

In some embodiments, the buffer component of the first transistor includes a material having a lattice constant different from that of the buffer component of the second transistor.

In some embodiments, each buffer component is a part of a first buffer pattern, and further includes a second buffer pattern sequentially disposed on the substrate, and each etch stop component may be disposed between the first buffer pattern and a respective second buffer component.

In some embodiments, each of the first and second transistors includes a plurality of fin structures. Each of the fin structures may include a corresponding channel component. For each transistor, the etch stop component may extend between the plurality of channel components when viewed from a plan view.

According to still other embodiments, a method of forming a semiconductor device includes: preparing a substrate including a first region and a second region; forming a first fin structure on each of the first and second regions, the first fin structure on each region including a composite layer and a first channel pattern on the composite layer, and the composite layer including a buffer pattern and an etch stop pattern; forming a recess region exposing the etch stop pattern on the second region by removing at least a portion of the first fin structure disposed on the second region; and forming a second fin structure on the second region by forming a second channel pattern in the recess region.

In some embodiments, the buffer pattern may be a first buffer pattern and a second buffer pattern sequentially disposed on the substrate, and the etch stop pattern may be formed between the first buffer pattern and the second buffer pattern. In this case, forming the recess region may include removing the first channel pattern and the second buffer pattern that are disposed on the second region.

In some embodiments, forming the second fin structure further includes forming an additional buffer pattern between the second channel pattern and the etch stop pattern.

BRIEF DESCRIPTION OF THE DRAWINGS

Various example embodiments will become more apparent in view of the attached drawings and accompanying detailed description.

DETAILED DESCRIPTION OF THE EMBODIMENTS

Figure 1:
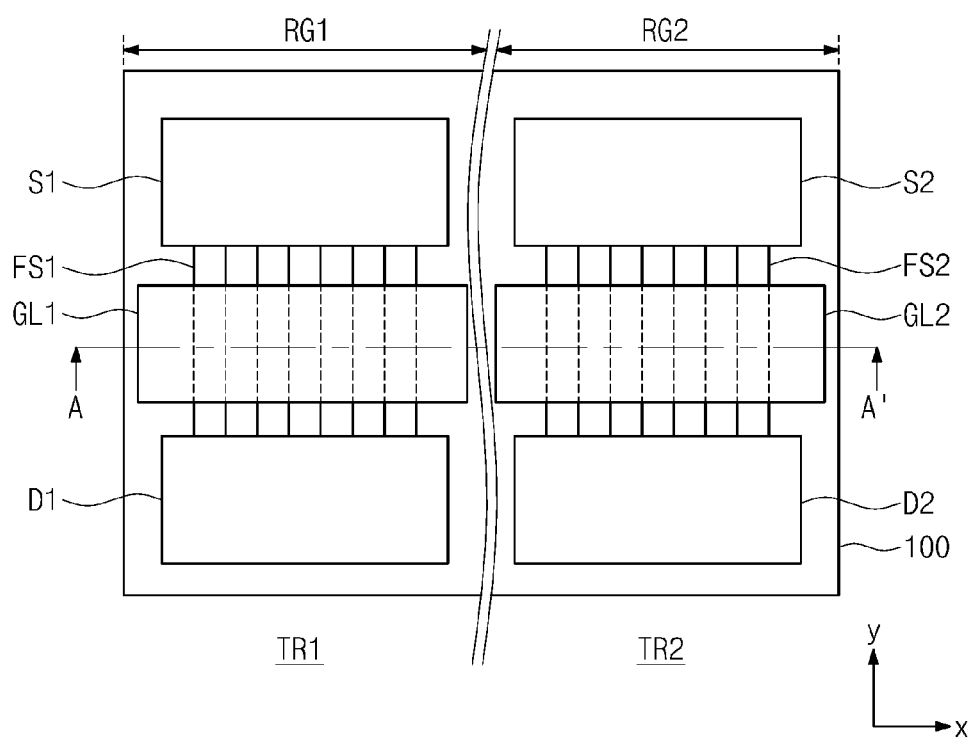
FIG. 1 is a plan view illustrating a semiconductor device according to some embodiments.

The present disclosure will now be described more fully hereinafter with reference to the accompanying drawings, in which exemplary embodiments of the disclosure are shown. The advantages and features of the disclosure and methods of achieving them will be apparent from the following exemplary embodiments that will be described in more detail with reference to the accompanying drawings. It should be noted, however, that the inventive concepts are not limited to the following exemplary embodiments, and may be implemented in various forms. In the drawings, embodiments of the disclosure are not limited to the specific examples provided herein and are exaggerated for clarity.

The terminology used herein is for the purpose of describing particular embodiments only and is not intended to limit the disclosure. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

It will be understood that when an element such as a layer, a component, a pattern, a region or a substrate is referred to as being "on" another element, it can be directly on the other element or intervening elements may be present. In contrast, the term "directly" means that there are no intervening elements. It will be further understood that the terms such as "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the disclosure. Accordingly, shapes of the exemplary views may be modified according to manufacturing techniques and/or allowable errors. Therefore, the embodiments of the disclosure are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. Unless indicated otherwise, these terms are only used to distinguish one element from another element. Thus, a first element in some embodiments could be termed a second element in other embodiments without departing from the teachings of the present disclosure. Exemplary embodiments of aspects of the present disclosure explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to limit the scope of example embodiments.

FIG. 1 is a plan view illustrating a semiconductor device according to some embodiments, and FIGS. 2 to 8 are cross-sectional views taken along a line A-A' of FIG. 1 to illustrate a method of forming a semiconductor device according to some embodiments.

Figure 2:
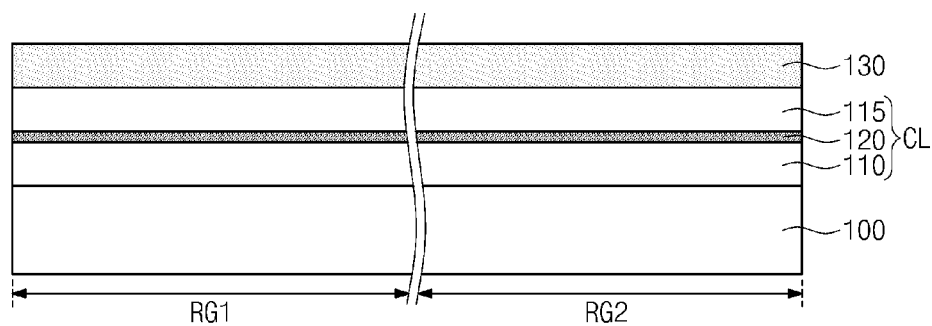
FIGS. 2 to 8 are cross-sectional views taken along a line A-A' of FIG. 1 to illustrate a method of forming a semiconductor device according to some embodiments.

Referring to FIGS. 1 and 2, a substrate 100 including a first region RG1 and a second region RG2 is provided. The substrate 100 may be a semiconductor substrate (e.g., a silicon substrate, a germanium substrate, or a silicon-germanium substrate) or a silicon-on-insulator (SOI) substrate. In some embodiments, the first region RG1 may be an N-type metal-oxide-semiconductor field effect transistor (NMOSFET) region, and the second region RG2 may be a P-type MOSFET (PMOSFET) region.

In one embodiment, a composite layer CL including a buffer layer 110 and/or 115 and an etch stop layer 120 is formed on the first region RG1 and the second region RG2 of the substrate 100. In the present embodiment, the buffer layer includes a first buffer layer 110 under the etch stop layer 120 and a second buffer layer 115 on the etch stop layer 120. A first channel layer 130 may be formed on the composite layer CL. Lattice constants of the first and second buffer layers 110 and 115 may be greater than a lattice constant of the first channel layer 130. The first buffer layer 110 and the second buffer layer 115 may be formed of the same material or different materials from each other. The etch stop layer 120 may include a material having an etch resistivity greater than that of the first buffer layer 110. The etch stop layer 120 may include a semiconductor material. The composite layer CL may be formed, for example, by performing an epitaxial growth process on the substrate 100. For example, the epitaxial growth process may be a chemical vapor deposition (CVD) process or a molecular beam epitaxy (MBE) process.

The materials of the first and second buffer layers 110 and 115, the etch stop layer 120 and the first channel layer 130 will be described in more detail with reference to a semiconductor device illustrated in FIG. 8 later.

Figure 3:
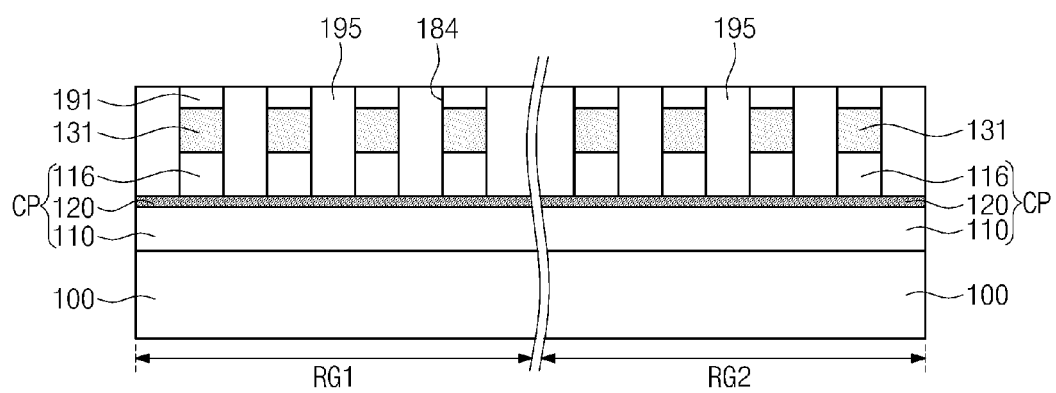

Referring to FIGS. 1 and 3, a first patterning process is performed to etch at least a portion of the first channel layer 130 and the second buffer layer 115, thereby forming a composite pattern CP and first channel patterns 131 on the first region RG1 and the second region RG2. The first patterning process may include a dry etching process using the etch stop layer 120. Thus, in one embodiment, the second buffer layer 115 is divided into a plurality of second buffer patterns 116 separated from each other, but the first buffer layer 110 is not etched. In some embodiments, the dry etching process may be performed using first mask patterns 191 as etch masks. The first mask patterns 191 may include, for example, at least one of silicon oxide, silicon nitride, and silicon oxynitride.

In one embodiment, first recess regions 184 exposing the etch stop layer 120 may be formed between the first channel patterns 131 by the first patterning process. An interlayer insulating layer 195 may be formed to fill the first recess regions 184. The interlayer insulating layer 195 may include, for example, at least one of a silicon oxide layer, a silicon nitride layer, and a silicon oxynitride layer. The formation process of the interlayer insulating layer 195 may include a deposition process of an insulating layer and a planarization process of the insulating layer. Top surfaces of the first mask patterns 191 may be exposed by the planarization process.

Figure 4:
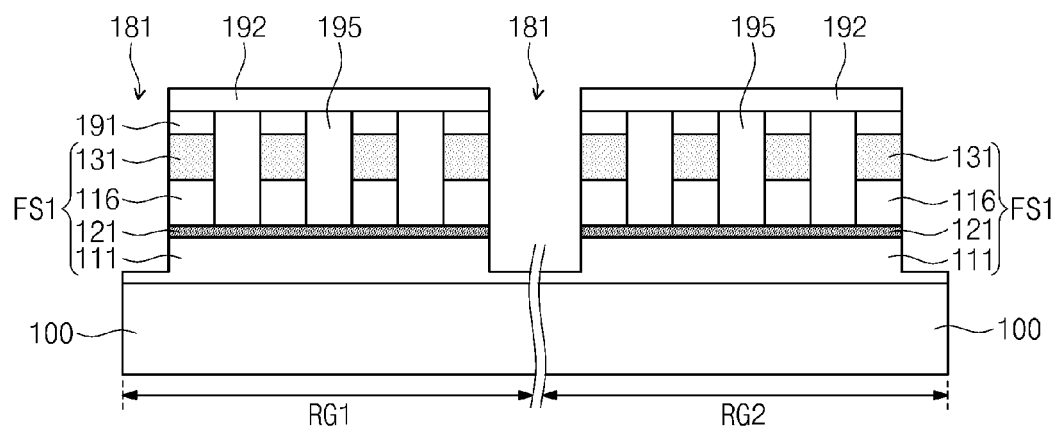

Referring to FIGS. 1 and 4, second mask patterns 192 is formed on the first mask patterns 191. The second mask pattern 192 on the first region RG1 may be formed to cover the first channel patterns 131 disposed on the first region RG1, and the second mask pattern 192 on the second region RG2 may be formed to cover the first channel patterns 131 on the second region RG2. The second mask patterns 192 may include, for example, at least one of a silicon oxide layer, a silicon nitride layer, and a silicon oxynitride layer.

In one embodiment, a second patterning process is performed using the second mask patterns 192 as etch masks to form trenches 181. At this time, the etch stop layer 120 and the first buffer layer 110 may be etched to form etch stop patterns 121 and first buffer patterns 111. As a result, a first fin structure FS1 may be formed on each of the first region RG1 and the second region RG2. The first fin structure FS1 may include the first buffer pattern 111, the etch stop pattern 121, the second buffer patterns 116 and the first channel patterns 131 that are sequentially stacked. The second patterning process may include a dry etching process.

Figure 5:
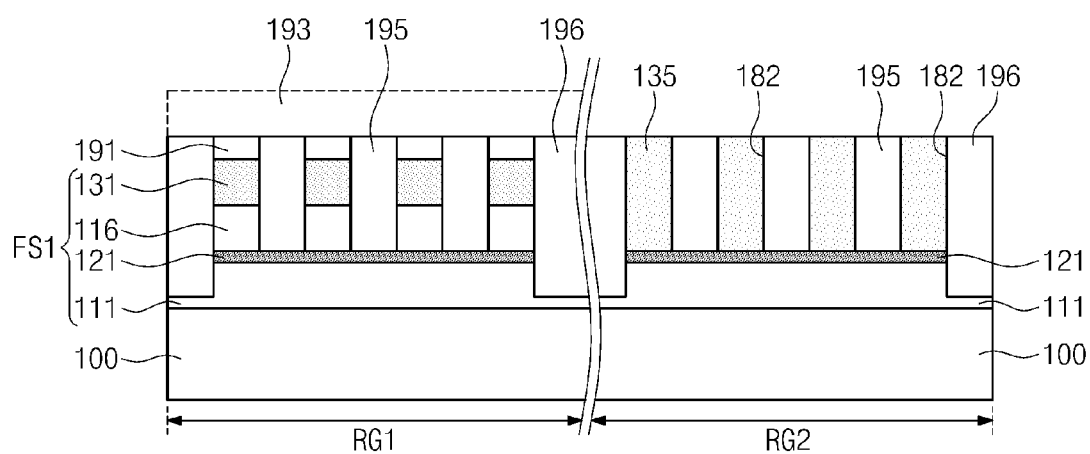

Referring to FIGS. 1 and 5, a device isolation layer 196 is formed to fill the trenches 181. In some embodiments, an insulating layer is formed to fill the trenches 181 and then a planarization process is performed on the insulating layer until the first mask patterns 191 are exposed, thereby forming the device isolation layer 196. As a result, the second mask patterns 192 are removed. In some embodiments, the device isolation layer 196 may include at least one of a silicon oxide layer, a silicon nitride layer, and a silicon oxynitride layer.

After the second mask patterns 192 are removed, a third mask pattern 193 may be formed to cover the first region RG1 and to expose the second region RG2. For example, the third mask pattern 193 may include at least one of a silicon oxide layer, a silicon nitride layer, and a silicon oxynitride layer. The first mask patterns 191, the first channel patterns 131 and the second buffer patterns 116 on the second region RG2 may be sequentially removed using the third mask pattern 193 as an etch mask. In some embodiments, the removal process of the first mask patterns 191, the first channel patterns 131 and the second buffer patterns 116 on the second region RG2 includes a plurality of selective etching processes. As a result, second recess regions 182 may be formed to expose the etch stop pattern 121 disposed on the second region RG2. The second recess regions 182 may be defined by sidewalls of the interlayer insulating layer 195, sidewalls of the device isolation layer 196 and a top surface of the etch stop pattern 121.

Preliminary third buffer patterns 135 may be formed in the second recess regions 182, respectively. The formation process of the preliminary third buffer patterns 135 may include, for example, a selective epitaxial growth (SEG) process and a planarization process. The third mask pattern 193 may be removed by the planarization process. The preliminary third buffer patterns 135 may be grown using the etch stop pattern 121 as a seed layer. In other embodiments, the formation process of the preliminary third buffer patterns 135 includes a deposition process and a thermal treatment process. The preliminary third buffer patterns 135 are illustrated to fill the second recess regions 182 in FIG. 5. However, inventive concepts are not limited thereto. In other embodiments, the preliminary third buffer patterns 135 may be confinedly formed in lower parts of the second recess regions 182. Hereinafter, the preliminary third buffer patterns 135 completely filling the second recess regions 182 will be described as an example for the purpose of ease and convenience in explanation.

Figure 6:
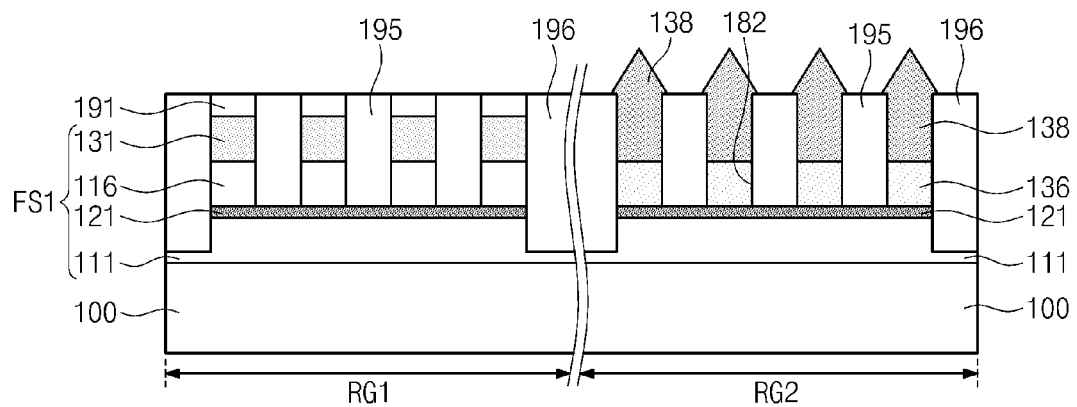

Referring to FIGS. 1 and 6, upper portions of the preliminary third buffer patterns 135 are removed to form third buffer patterns 136. The third buffer patterns 136 may be formed by a selective etching process. The first channel patterns 131 on the first region RG1 may be covered by the first mask patterns 191 and consequently may not be etched. In some embodiments, top surfaces of the third buffer patterns 136 are formed to be disposed at a substantially same level as top surfaces of the second buffer patterns 116 disposed on the first region RG1. However, the inventive concepts are not limited thereto.

Preliminary second channel patterns 138 may be formed to fill the second region regions 182 on the third buffer patterns 136. The formation process of the preliminary second channel patterns 138 may include a SEG process using the third buffer patterns 136 as a seed layer. In some embodiments, as illustrated in FIG. 6, the preliminary second channel patterns 138 may be over-grown such that top surfaces of the preliminary second channel patterns 138 are higher than a top surface of the interlayer insulating layer 195. However, the inventive concepts are not limited thereto.

Figure 7:
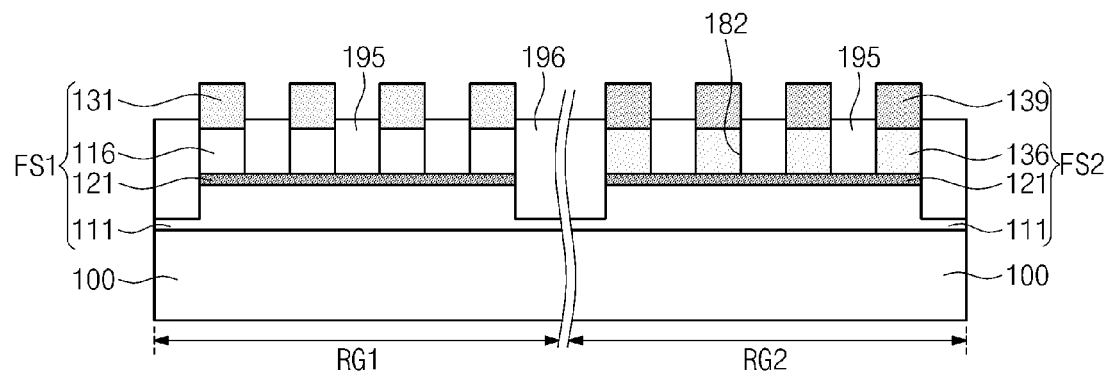

Referring to FIGS. 1 and 7, a planarization process is performed until the first channel patterns 131 of the first region RG1 are exposed. As a result, second channel patterns 139 may be formed from the preliminary second channel patterns 138. Thus, a second fin structure FS2 is formed on the second region RG2. The second fin structure FS2 may include the first buffer pattern 111, the etch stop pattern 121, the third buffer patterns 136 and the second channel patterns 139 that are sequentially stacked on the second region RG2 of the substrate 100.

In some embodiments, top surfaces of the second channel patterns 139 may be disposed at a substantially same level as top surfaces of the first channel patterns 131. An upper portion of the interlayer insulating layer 195 and an upper portion of the device isolation layer 196 may be etched to expose sidewalls of the first and second channel patterns 131 and 139. Top surfaces of the etched interlayer insulating layer 195 and the etched device isolation layer 196 may be higher than bottom surfaces of the first and second channel patterns 131 and 139 or may be lower than the bottom surfaces of the first and second channel patterns 131 and 139.

Figure 8:
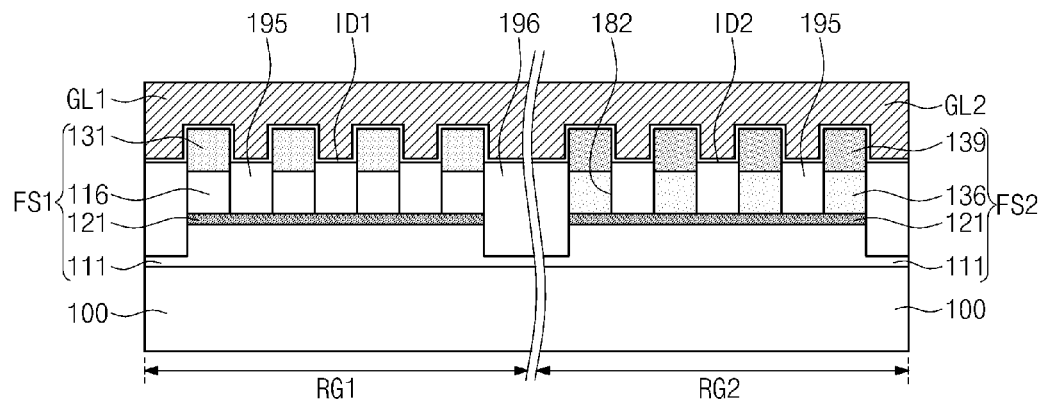

Referring to FIGS. 1 and 8, a first gate dielectric layer ID1 and a first gate electrode GL1 may be sequentially formed on the first region RG1, and a second gate dielectric layer ID2 and a second gate electrode GL2 may be sequentially formed on the second region RG2. Each of the first and second gate dielectric layers ID1 and ID2 may include silicon oxide. Alternatively, each of the first and second gate dielectric layers ID1 and ID2 may include a high-k dielectric material having a dielectric constant higher than that of silicon oxide. For example, each of the first and second gate dielectric layers ID1 and ID2 may include hafnium oxide ($HfO_2$), zirconium oxide ($ZrO_2$), or tantalum oxide ($Ta_2O_5$). Each of the first and second gate electrodes GL1 and GL2 may include a conductive material. For example, each of the first and second gate electrodes GL1 and GL2 may include at least one of doped silicon, a metal, and a conductive metal nitride (e.g., titanium nitride (TiN) and/or tantalum nitride (TaN)). A work function of the first gate electrode GL1 may be different from a work function of the second gate electrode GL2.

In one embodiment, the first gate electrode GL1 may extend between a first source region S1 and a first drain region D1 on the first region RG1. The second gate electrode GL2 may extend between a second source region S2 and a second drain region D2 on the second region RG2. The first and second source regions S1 and S2 and the first and second drain regions D1 and D2 may be formed after the formation of the first and second gate electrodes GL1 and GL2. In the event that the first region RG1 is the NMOSFET region and the second region RG2 is the PMOSFET region, the second source region S2 and the second drain region D2 may include a material having a lattice constant greater than that of the second channel patterns 139 of the second region RG2. In some embodiments, if the second channel patterns 139 are formed of silicon (Si), the second source region S2 and the second drain region D2 may be formed of silicon-germanium (SiGe). If the second source and drain regions S2 and D2 including the material having the relatively great lattice constant are in contact with the second channel patterns 139 having the relatively small lattice constant, lattices of the second source and drain regions S2 and D2 are compressed according to the second channel patterns 139. As a result, a compressive stress is generated in the second source region S2 and the second drain region D2. Thus, the second source region S2 and the second drain region D2 may apply the compressive stress to the second channel patterns 139 to improve mobility of carriers in the second channel patterns 139. On the contrary, the first source region S1 and the first drain region D1 may be formed of the same material as the first channel patterns 131. In some embodiments, if the first channel patterns 131 are formed of silicon, the first source region S1 and the first drain region D1 may be formed of silicon.

The semiconductor device according to some embodiments will be described with reference to FIGS. 1 and 8.

A first transistor TR1 may be provided on a first region RG1 of a substrate 100, and a second transistor TR2 may be provided on a second region RG2 of the substrate 100. The first and second transistors TR1 and TR2 may be fin field effect transistors including active channels protruding from the substrate 100. Hereinafter, the transistors TR1 and TR2 of the fin field effect transistors will be described as an example. However, the inventive concepts are not limited thereto. The first transistor TR1 may include a first fin structure FS1 and the second transistor TR2 may include a second fin structure FS2. The first fin structure FS1 may connect a first source region S1 to a first drain region D1, and the second fin structure FS2 may connect a second source region S2 to a second drain region D2. A first gate dielectric layer ID1 and a first gate electrode GL1 covering the first fin structure FS1 may be provided between the first source region S1 and the first drain region D1. A second gate dielectric layer ID2 and a second gate electrode GL2 covering the second fin structure FS2 may be provided between the second source region S2 and the second drain region D2. The first and second fin structures FS1 and FS2 will be described in more detail hereinafter.

In one embodiment, the first fin structure FS1 may include a buffer pattern 111 and/or 116 on the substrate 100 and a first channel pattern 131 on the buffer pattern 111 and/or 116. The buffer pattern may include a first buffer pattern 111 on the substrate 100 and a second buffer pattern 116 on the first buffer pattern 111. In some embodiments, the second buffer pattern 116 may be provided in plural and the first channel pattern 131 may be provided in plural. However, the inventive concepts are not limited thereto. Hereinafter, the plurality of second buffer patterns 116 and the plurality of first channel patterns 131 provided on the substrate 100 will be described as an example for the purpose of ease and convenience in explanation.

In one embodiment, an etch stop pattern 121 may be provided between the substrate 100 and the first channel patterns 131. In the present embodiment, the etch stop pattern 121 may be disposed between the first buffer pattern 111 and the second buffer patterns 116. The etch stop pattern 121 may extend between the plurality of first channel patterns 131 when viewed from a plan view. In other words, the etch stop pattern 121 may be connected in common to the bottom surfaces of the first channel patterns 131. The first buffer pattern 111 may be connected to the plurality of first channel patterns 131 through the etch stop pattern 121.

In one embodiment, the second fin structure FS2 may include a buffer pattern 111 and/or 136 on the substrate 100 and a second channel pattern 139 on the buffer pattern 111 and/or 136. The buffer pattern may include a first buffer pattern 111 on the substrate 100 of the second region RG2 and a third buffer pattern 136 on the first buffer pattern 111 on the second region RG2. The first buffer pattern 111 of the second fin structure FS2 may be formed simultaneously with the first buffer pattern 111 of the first fin structure FS1. Thus, the first buffer pattern 111 of the second fin structure FS2 may include the same material as the first buffer pattern 111 of the first fin structure FS1. In some embodiments, the third buffer pattern 136 may be provided in plural and the second channel pattern 139 may be provided in plural. However, the inventive concepts are not limited thereto. Hereinafter, the plurality of third buffer patterns 136 and the plurality of second channel patterns 139 provided on the second region RG2 will be described as an example for the purpose of ease and convenience in explanation.

In one embodiment, an etch stop pattern 121 may be provided between the substrate 100 of the second region RG2 and the second channel patterns 139. In the present embodiment, the etch stop pattern 121 may be disposed between the first buffer pattern 111 and the third buffer patterns 136. The etch stop pattern 121 of the second fin structure FS2 may be formed simultaneously with the etch stop pattern 121 of the first fin structure FS1. Thus, the etch stop pattern 121 of the second fin structure FS2 may include the same material as the etch stop pattern 121 of the first fin structure FS1. The etch stop pattern 121 may extend between the plurality of second channel patterns 139 when viewed from a plan view. In other words, the etch stop pattern 121 may be connected in common to bottom surfaces of the second channel patterns 139. The first buffer pattern 111 on the second region RG2 may be connected to the plurality of second channel patterns 139 through the etch stop pattern 121.

Hereinafter, the materials of the buffer patterns 111, 116 and 136, the channel patterns 131 and 139 and the etch stop pattern 121 will be described with reference to the following table 1.

TABLE 1

| Embodiment | First channel pattern | Second buffer pattern | Second channel pattern | Third buffer pattern | First buffer pattern | Etch stop pattern |
|---|---|---|---|---|---|---|
| 1 | Si | $Si_{1-x}Ge_x$ | Ge | $Si_{1-y}Ge_y$ | $Si_{1-z}Ge_z$ | SiGeC or Si |
| 2 | $In_{1-x}Ga_xAs$ | $In_{1-y}Ga_yAs$ (x > y) | Ge | $Si_{1-z}Ge_z$ | $In_{1-w}Ga_wAs$ | AlGaAs |
| 3 | $In_{1-x}Ga_xAs$ | $In_{1-y}Ga_yAs$ (x > y) | $In_{1-z}Ga_zAs$ | $In_{1-w}Ga_wAs$ (z < w) | $In_{1-v}Ga_vAs$ | AlGaAs |
| 4 | $Si_{1-x}Ge_x$ | $Si_{1-y}Ge_y$ (x < y) | $Si_{1-z}Ge_z$ | $Si_{1-w}Ge_w$ (z > w) | $Si_{1-v}Ge_v$ | SiGeC or Si |

In the table 1, composition ratios of elements of the materials are expressed using designators "v", "w", "x", "y", and "z". In the table 1, the material not having the designator of the composition ratio may include all composition ratios of two or three elements thereof. Even though the materials respectively included in different embodiments have the same designator, the same designator may have a different value according to the embodiments.

In one embodiment, a lattice constant of the second buffer patterns 116 may be greater than a lattice constant of the first channel patterns 131 provided on the second buffer patterns 116. In some embodiments, if the first channel patterns 131 include silicon (Si), the second buffer patterns 116 may include $Si_{1-x}Ge_x$, as illustrated in the first embodiment of the table 1. A lattice constant (about 5.646 Å) of germanium (Ge) is greater than a lattice constant (about 5.430 Å) of silicon (Si) at an absolute temperature of 300K without an external stress. Thus, the lattice constant of the second buffer patterns 116 including germanium may be greater than the lattice constant of the first channel patterns 131. If the first channel patterns 131 having the lattice constant smaller than that of the second buffer patterns 116 are formed on the second buffer patterns 116 by an epitaxial process, lattices of the first channel patterns 131 may be horizontally strained as compared with the state not applied with the external stress by interface matching of lattices of the second buffer patterns 116 and the lattices of the first channel patterns 131. As a result, a tensile stress may be generated in the first channel patterns 131. Carrier mobility of an NMOSFET may be improved by the tensile-strained first channel patterns 131.

In one embodiment, a lattice constant of the third buffer patterns 136 may be smaller than a lattice constant of the second channel patterns 139 provided on the third buffer patterns 136. In some embodiments, if the second channel patterns 139 include germanium (Ge), the third buffer patterns 136 may include $Si_{1-y}Ge_y$, as illustrated in the first embodiment of the table 1. Here, "y" may be equal to or different from "x" of the second buffer patterns 116. As described above, the lattice constant (about 5.646 Å) of germanium (Ge) is greater than the lattice constant (about 5.430 Å) of silicon (Si). Thus, the lattice structure of the third buffer patterns 136 including silicon may be smaller than that of the second channel patterns 139. If the second channel patterns 139 having the lattice constant greater than that of the third buffer patterns 136 are formed on the third buffer patterns 136 by an epitaxial process, lattices of the second channel patterns 139 may be horizontally reduced as compared with the state not applied with the external stress by interface matching of lattices of the third buffer patterns 136 and the lattices of the second channel patterns 139. As a result, a compressive stress may be generated in the second channel patterns 139. Carrier mobility of a PMOSFET may be improved by the compressive-strained second channel patterns 139.

The first buffer pattern 111 may include the same material as the second buffer patterns 116. In some embodiments, the second buffer patterns 116 may include $Si_{1-x}Ge_x$ and the first buffer pattern 111 may include $Si_{1-z}Ge_z$, as illustrated in the first embodiment of the table 1. Here, "x" may be equal to "z". In some embodiments, each of "x" and "z" may be 30. Alternatively, "x" may be different from "z".

The third buffer patterns 136 may include the same material as the first buffer pattern 111. In some embodiments, the third buffer patterns 136 may include $Si_{1-y}Ge_y$ and the first buffer pattern 111 may include $Si_{1-z}Ge_z$, as illustrated in the first embodiment of the table 1. Here, "y" may be different from "z". In some embodiments, "y" may be 70 and "z" may be 30. In other embodiments, the third buffer patterns 136 may include a different material from the first buffer pattern 111, as illustrated in the second embodiment of table 1. In some embodiments, the third buffer patterns 136 may include a IV group semiconductor material, and the first buffer pattern 111 may include a III-V group compound semiconductor material.

In one embodiment, the etch stop pattern 121 may include a material having an etch resistivity greater than that of the first buffer pattern 111. In some embodiments, if the first buffer pattern 111 includes silicon-germanium (SiGe), the etch stop pattern 121 may include silicon-germanium-carbon (SiGeC) or silicon (Si), as illustrated in the first and fourth embodiments of the table 1. As illustrated in the second and third embodiments of the table 1, if the first buffer pattern 11 includes indium-gallium-arsenic (InGaAs), the etch stop pattern 121 may include aluminum-gallium-arsenic (AlGaAs).

According to the disclosed embodiments, the tensile stress and the compressive stress may be provided in channel regions of the NMOSFET and the PMOSFET, respectively. Thus, the carrier mobility may be increased to improve operation characteristics of the transistors. A formation process of an NMOSFET and a PMOSFET providing opposite stresses may need a process of forming a semiconductor layer on an NMOSFET region and a PMOSFET region, a process of removing the semiconductor layer on one of the two regions, and a process of re-growing a second semiconductor layer on the one of the two regions. In this case, an etch-loading effect causing a non-uniform etching state may occur under the influence of a position of the etched region on a wafer and a density and sizes of removed fins. Additionally, the second semiconductor may be non-uniformly re-grown under the influence of a position of the re-grown region on the wafer and a density and sizes of re-grown fins. As a result, thickness dispersions of buffer patterns and channel patterns may be caused to increase characteristic dispersion of a semiconductor device.

According to the disclosed embodiments, characteristic dispersion of the semiconductor device may be reduced by the etching process and the re-growth process using the etch stop layer. In other words, depths of the recess regions may be substantially uniform by the etch stop layer, so that a thickness of the semiconductor layer re-formed in the recess regions may be substantially uniform. Additionally, according to some embodiments, the channel patterns may include germanium or a III-V group compound semiconductor. In other words, the channel pattern in itself may have high carrier mobility. Thus, a complementary metal-oxide-semiconductor (CMOS) structure providing channel materials having the high carrier mobility may be easily formed.

Figure 9:
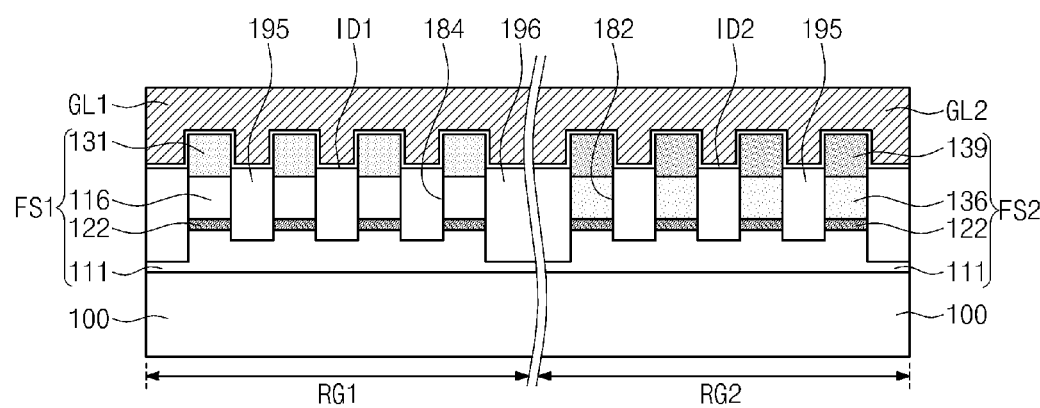
FIG. 9 is a cross-sectional view taken along a line A-A' of FIG. 1 to illustrate a semiconductor device according to other embodiments.

FIG. 9 is a cross-sectional view taken along a line A-A' of FIG. 1 to illustrate a semiconductor device according to other embodiments. In the present embodiment, the descriptions to the same elements as described with reference to FIGS. 1 to 8 will be omitted or mentioned briefly for the purpose of ease and convenience in explanation.

In the present embodiment, an etch stop pattern 122 may be confinedly provided under each of the second and third buffer patterns 116 and 136 and may not extend between the buffer patterns adjacent to each other. When the first recess regions 184 of FIG. 3 are formed, the etch stop layer 120 may be penetrated by over-etching, thereby forming the etch stop patterns 122 of the present embodiment. The interlayer insulating layer 195 formed in the first recess regions 184 may be connected to the first buffer pattern 111 between the etch stop patterns 122.

FIGS. 10 to 16 are cross-sectional views taken along a line A-A' of FIG. 1 to illustrate a method of forming a semiconductor device according to still other embodiments. In the present embodiment, the descriptions to the same elements as described in the above embodiments will be omitted or mentioned briefly for the purpose of ease and convenience in explanation.

Figure 10:
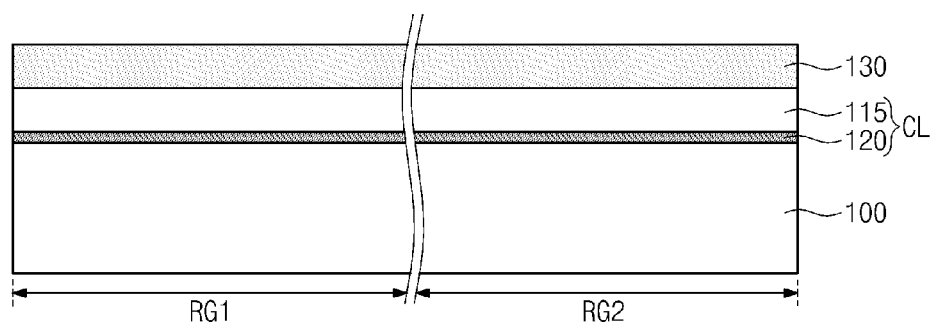
FIGS. 10 to 16 are cross-sectional views taken along a line A-A' of FIG. 1 to illustrate a method of forming a semiconductor device according to still other embodiments.

Referring to FIGS. 1 and 10, a substrate 100 including a first region RG1 and a second region RG2 may be provided. The substrate 100 may be a semiconductor substrate (e.g., a silicon substrate, a germanium substrate, or a silicon-germanium substrate) or a silicon-on-insulator (SOI) substrate. In some embodiments, the first region RG1 may be an NMOSFET region, and the second region RG2 may be a PMOSFET region.

A composite layer CL including a second buffer layer 115 and an etch stop layer 120 may be disposed on the first region RG1 and the second region RG2 of the substrate 100. A first channel layer 130 may be formed on the composite layer CL. In the present embodiment, the etch stop layer 120 may be disposed under the second buffer layer 115, and the second buffer layer 115 may be in contact with the first channel layer 130.

In one embodiment, a lattice constant of the second buffer layer 115 may be greater than a lattice constant of the first channel layer 130. The etch stop layer 120 may include a material having an etch resistivity greater than that of the second buffer layer 115. The etch stop layer 120 may include a semiconductor material. The composite layer CL may be formed by performing an epitaxial growth process on the substrate 100. For example, the epitaxial growth process may be a chemical vapor deposition (CVD) process or a molecular beam epitaxy (MBE) process.

The materials of the second buffer layer 115, the etch stop layer 120 and the first channel layer 130 may be the same as described with reference to the table 1.

Figure 11:
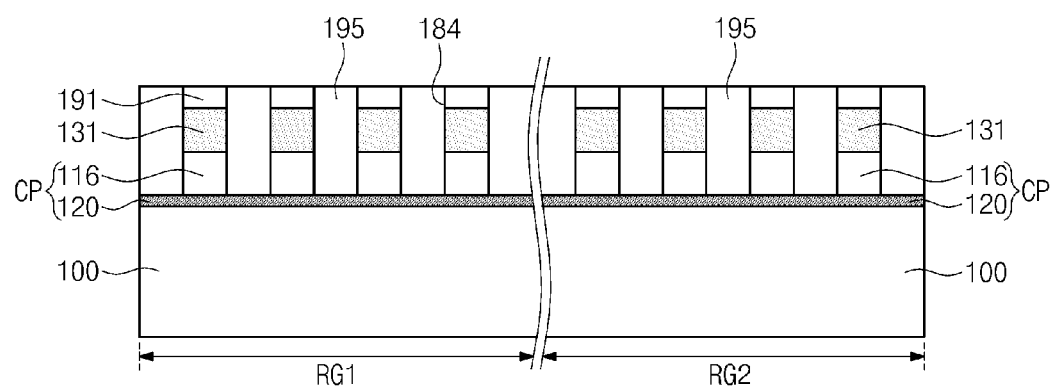

Referring to FIGS. 1 and 11, a first patterning process may be performed to etch at least a portion of the first channel layer 130 and the second buffer layer 115, thereby forming a composite pattern CP and first channel patterns 131 on the first region RG1 and the second region RG2. The first patterning process may include a dry etching process using the etch stop layer 120. Thus, the second buffer layer 115 may be divided into a plurality of second buffer patterns 116 separated from each other. In some embodiments, the dry etching process may be performed using first mask patterns 191 as etch masks. The first mask patterns 191 may include at least one of silicon oxide, silicon nitride, and silicon oxynitride.

In one embodiment, first recess regions 184 exposing the etch stop layer 120 may be formed between the first channel patterns 131 by the first patterning process. An interlayer insulating layer 195 may be formed to fill the first recess regions 184. The interlayer insulating layer 195 may include at least one of a silicon oxide layer, a silicon nitride layer, and a silicon oxynitride layer. The formation process of the interlayer insulating layer 195 may include a deposition process of an insulating layer and a planarization process of the insulating layer. Top surfaces of the first mask patterns 191 may be exposed by the planarization process.

Figure 12:
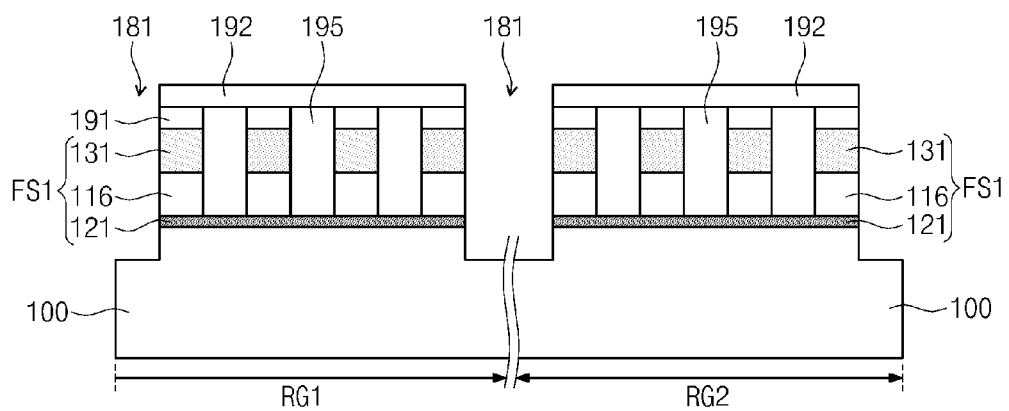

Referring to FIGS. 1 and 12, second mask patterns 192 may be formed on the first mask patterns 191. The second mask pattern 192 on the first region RG1 may be formed to cover the first channel patterns 131 disposed on the first region RG1, and the second mask pattern 192 on the second region RG2 may be formed to cover the first channel patterns 131 on the second region RG2. The second mask patterns 192 may include at least one of a silicon oxide layer, a silicon nitride layer, and a silicon oxynitride layer.

In one embodiment, a second patterning process may be performed using the second mask patterns 192 as etch masks to form trenches 181. As a result, the etch stop layer 120 may be etched to form etch stop patterns 121. Thus, a first fin structure FS1 may be formed on each of the first region RG1 and the second region RG2. The first fin structure FS1 may include the etch stop pattern 121, the second buffer patterns 116 and the first channel patterns 131 that are sequentially stacked on each of the first and second regions RG1 and RG2. During the second patterning process, portions of the substrate 100 may also be etched. The second patterning process may include a dry etching process.

Figure 13:
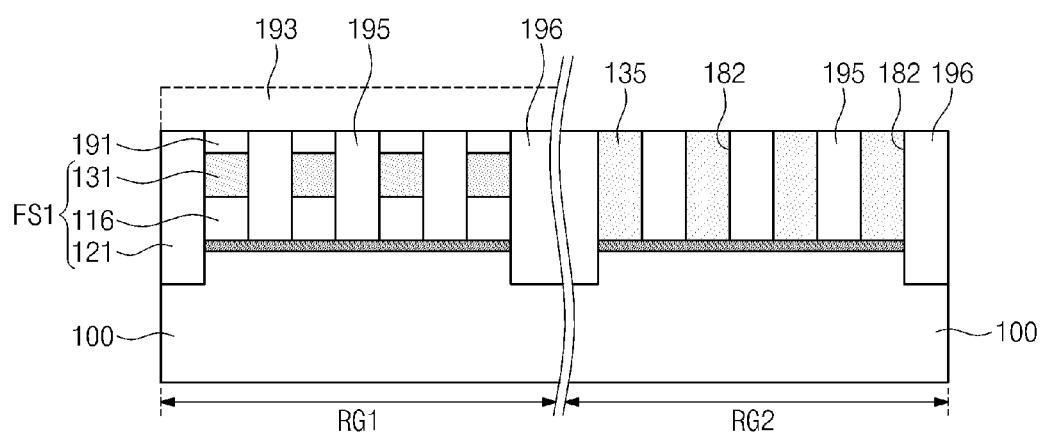

Referring to FIGS. 1 and 13, a device isolation layer 196 may be formed to fill the trenches 181. In some embodiments, an insulating layer may be formed to fill the trenches 181 and then a planarization process may be performed on the insulating layer until the first mask patterns 191 are exposed, thereby forming the device isolation layer 196. As a result, the second mask patterns 192 may be removed. In some embodiments, the device isolation layer 196 may include at least one of a silicon oxide layer, a silicon nitride layer, and a silicon oxynitride layer.

After the second mask patterns 192 are removed, a third mask pattern 193 may be formed to cover the first region RG1 and to expose the second region RG2. For example, the third mask pattern 193 may include at least one of a silicon oxide layer, a silicon nitride layer, and a silicon oxynitride layer. The first mask patterns 191, the first channel patterns 131 and the second buffer patterns 116 on the second region RG2 may be sequentially removed using the third mask pattern 193 as an etch mask. In some embodiments, the removal process of the first mask patterns 191, the first channel patterns 131 and the second buffer patterns 116 on the second region RG2 may include a plurality of selective etching processes. As a result, second recess regions 182 may be formed to expose the etch stop pattern 121 disposed on the second region RG2. The second recess regions 182 may be defined by sidewalls of the interlayer insulating layer 195, sidewalls of the device isolation layer 196 and a top surface of the etch stop pattern 121.

Preliminary third buffer patterns 135 may be formed in the second recess regions 182, respectively. The formation process of the preliminary third buffer patterns 135 may include a selective epitaxial growth (SEG) process and a planarization process. The third mask pattern 193 may be removed by the planarization process. The preliminary third buffer patterns 135 may be grown using the etch stop pattern 121 as a seed layer. In other embodiments, the formation process of the preliminary third buffer patterns 135 may include a deposition process and a thermal treatment process. The preliminary third buffer patterns 135 are illustrated to completely fill the second recess regions 182 in FIG. 13. However, inventive concepts are not limited thereto. In other embodiments, the preliminary third buffer patterns 135 may be confinedly formed in lower parts of the second recess regions 182. Hereinafter, the preliminary third buffer patterns 135 completely filling the second recess regions 182 will be described as an example for the purpose of ease and convenience in explanation.

Figure 14:
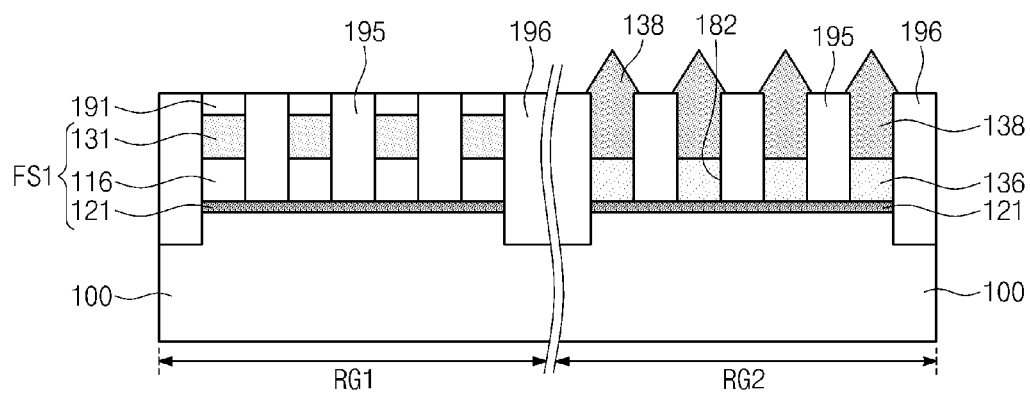

Referring to FIGS. 1 and 14, upper portions of the preliminary third buffer patterns 135 may be removed to form third buffer patterns 136. The third buffer patterns 136 may be formed by a selective etching process. The first channel patterns 131 on the first region RG1 may be covered by the first mask patterns 191 and consequently may not be etched. In some embodiments, top surfaces of the third buffer patterns 136 may be formed to be disposed at a substantially same level as top surfaces of the second buffer patterns 116 disposed on the first region RG1. However, the inventive concepts are not limited thereto.

Preliminary second channel patterns 138 may be formed to fill the second region regions 182 on the third buffer patterns 136. The formation process of the preliminary second channel patterns 138 may include a SEG process using the third buffer patterns 136 as a seed layer. In some embodiments, as illustrated in FIG. 14, the preliminary second channel patterns 138 may be over-grown such that top surfaces of the preliminary second channel patterns 138 may be higher than a top surface of the interlayer insulating layer 195. However, the inventive concepts are not limited thereto.

Figure 15:
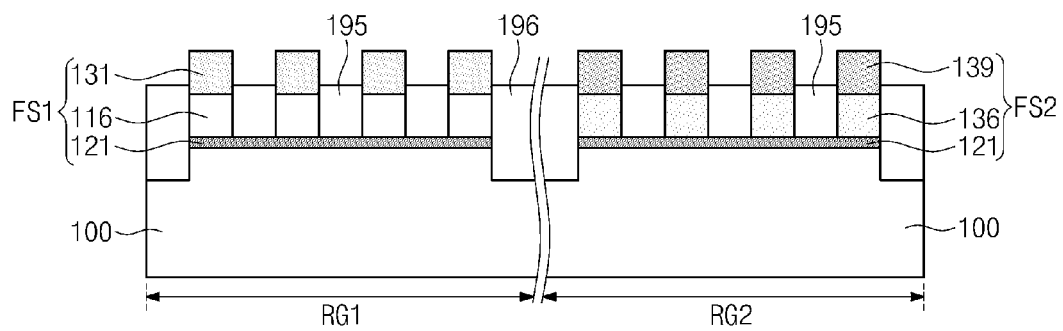

Referring to FIGS. 1 and 15, a planarization process may be performed until the first channel patterns 131 of the first region RG1 are exposed. As a result, second channel patterns 139 may be formed from the preliminary second channel patterns 138. Thus, a second fin structure FS2 may be formed on the second region RG2. The second fin structure FS2 may include the etch stop pattern 121, the third buffer patterns 136 and the second channel patterns 139 that are sequentially stacked on the second region RG2 of the substrate 100. In some embodiments, top surfaces of the second channel patterns 139 may be disposed at a substantially same level as top surfaces of the first channel patterns 131. An upper portion of the interlayer insulating layer 195 and an upper portion of the device isolation layer 196 may be etched to expose sidewalls of the first and second channel patterns 131 and 139. Top surfaces of the etched interlayer insulating layer 195 and the etched device isolation layer 196 may be higher than bottom surfaces of the first and second channel patterns 131 and 139 or may be lower than the bottom surfaces of the first and second channel patterns 131 and 139.

Figure 16:
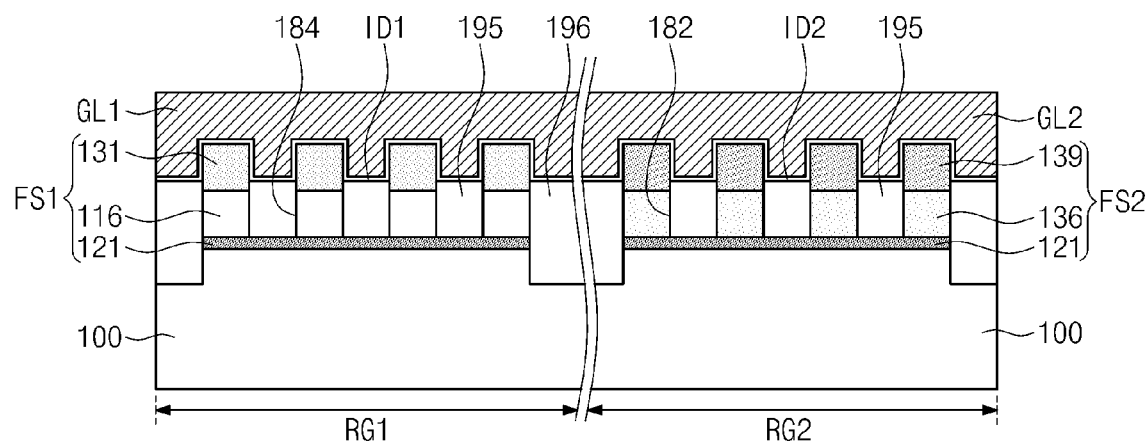

Referring to FIGS. 1 and 16, a first gate dielectric layer ID1 and a first gate electrode GL1 may be sequentially formed on the first region RG1, and a second gate dielectric layer ID2 and a second gate electrode GL2 may be sequentially formed on the second region RG2. The first and second gate dielectric layers ID1 and ID2 may include silicon oxide. Alternatively, the first and second gate dielectric layers ID1 and ID2 may include a high-k dielectric material having a dielectric constant higher than that of silicon oxide. For example, each of the first and second gate dielectric layers ID1 and ID2 may include hafnium oxide ($HfO_2$), zirconium oxide ($ZrO_2$), or tantalum oxide ($Ta_2O_5$). The first and second gate electrodes GL1 and GL2 may include a conductive material. For example, each of the first and second gate electrodes GL1 and GL2 may include at least one of doped silicon, a metal, and a conductive metal nitride (e.g., titanium nitride (TiN) and/or tantalum nitride (TaN)). A work function of the first gate electrode GL1 may be different from a work function of the second gate electrode GL2.

The first gate electrode GL1 may extend between a first source region S1 and a first drain region D1 on the first region RG1. The second gate electrode GL2 may extend between a second source region S2 and a second drain region D2 on the second region RG2. The first and second source regions S1 and S2 and the first and second drain regions D1 and D2 may be formed after the formation of the first and second gate electrodes GL1 and GL2. If the first region RG1 is the NMOSFET region and the second region RG2 is the PMOSFET region, the second source region S2 and the second drain region D2 may include a material having a lattice constant greater than that of the second channel patterns 139 of the second region RG2. In some embodiments, if the second channel patterns 139 are formed of silicon (Si), the second source region S2 and the second drain region D2 may be formed of silicon-germanium (SiGe). If the second source and drain regions S2 and D2 including the material having the relatively great lattice constant are in contact with the second channel patterns 139 having the relatively small lattice constant, lattices of the second source and drain regions S2 and D2 are compressed according to the second channel patterns 139. As a result, a compressive stress is generated in the second source region S2 and the second drain region D2. Thus, the second source region S2 and the second drain region D2 may apply the compressive stress to the second channel patterns 139 to improve mobility of carriers in the second channel patterns 139. On the contrary, the first source region S1 and the first drain region D1 may be formed of the same material as the first channel patterns 131. In some embodiments, if the first channel patterns 131 are formed of silicon, the first source region S1 and the first drain region D1 may be formed of silicon.

Figure 17:
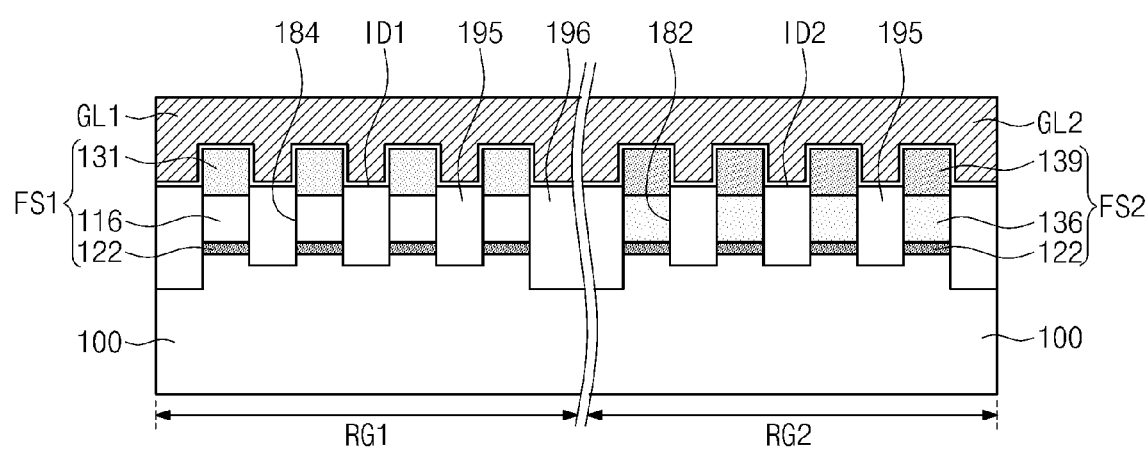
FIG. 17 is a cross-sectional view taken along a line A-A' of FIG. 1 to illustrate a semiconductor device according to even other embodiments.

FIG. 17 is a cross-sectional view taken along a line A-A' of FIG. 1 to illustrate a semiconductor device according to even other embodiments. In the present embodiment, the descriptions to the same elements as described in the aforementioned embodiments will be omitted or mentioned briefly for the purpose of ease and convenience in explanation.

In the present embodiment, an etch stop pattern 122 may be confinedly provided under each of the second and third buffer patterns 116 and 136 and may not extend between the buffer patterns adjacent to each other. When the first recess regions 184 of FIG. 11 are formed, the etch stop layer 120 may be penetrated by over-etching, thereby forming the etch stop patterns 122 of the present embodiment. The interlayer insulating layer 195 formed in the first recess regions 184 may be connected to the substrate 100 between the etch stop patterns 122.

FIGS. 18 to 23 are cross-sectional views taken along a line A-A' of FIG. 1 to illustrate a method of forming a semiconductor device according to yet other embodiments. In the present embodiment, the descriptions to the same elements as described in the aforementioned embodiments will be omitted or mentioned briefly for the purpose of ease and convenience in explanation.

Figure 18:
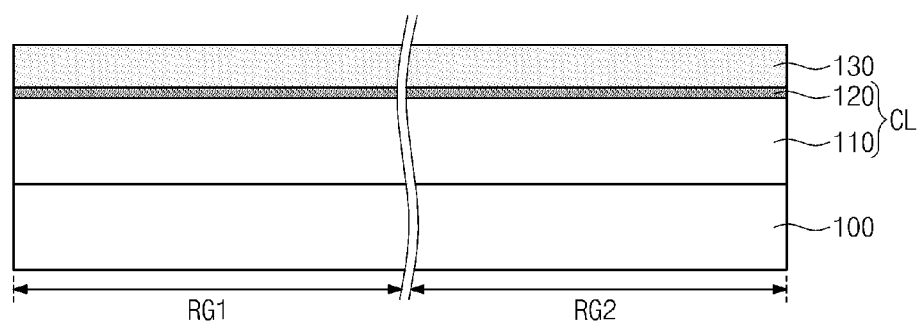
FIGS. 18 to 23 are cross-sectional views taken along a line A-A' of FIG. 1 to illustrate a method of forming a semiconductor device according to yet other embodiments.

Referring to FIGS. 1 and 18, a substrate 100 including a first region RG1 and a second region RG2 may be provided.

The substrate 100 may be a semiconductor substrate (e.g., a silicon substrate, a germanium substrate, or a silicon-germanium substrate) or a silicon-on-insulator (SOI) substrate. In some embodiments, the first region RG1 may be an NMOSFET region, and the second region RG2 may be a PMOSFET region.

A composite layer CL including a first buffer layer 110 and an etch stop layer 120 may be formed on the first region RG1 and the second region RG2 of the substrate 100. A first channel layer 130 may be formed on the composite layer CL. In the present embodiment, the etch stop layer 120 may be disposed on the first buffer layer 110 and may be in contact with the first channel layer 130.

In one embodiment, the etch stop layer 120 may include a material having an etch resistivity greater than that of the first buffer layer 110. The etch stop layer 120 may include a semiconductor material. The composite layer CL may be formed by performing an epitaxial growth process on the substrate 100. For example, the epitaxial growth process may be a chemical vapor deposition (CVD) process or a molecular beam epitaxy (MBE) process.

Materials of the first buffer layer 110, the etch stop layer 120 and the first channel layer 130 may be the same as described with reference to the table 1.

Figure 19:
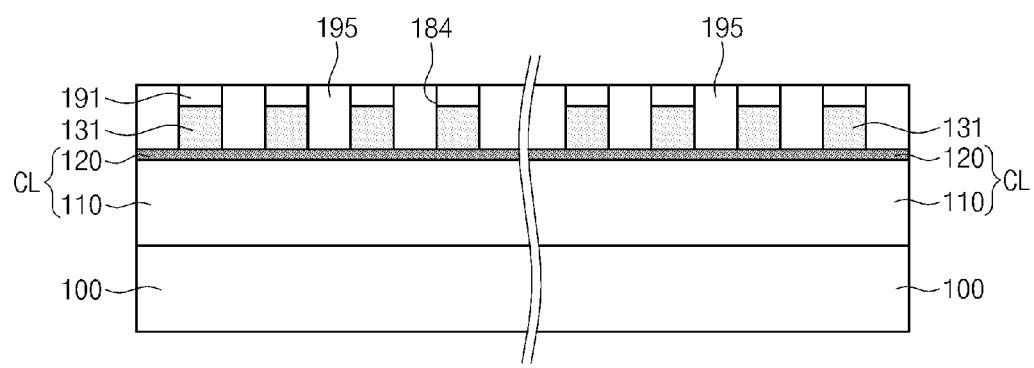

Referring to FIGS. 1 and 19, a first patterning process may be performed to etch at least a portion of the first channel layer 130, thereby forming first channel patterns 131 on the first region RG1 and the second region RG2. The first patterning process may include a dry etching process using the etch stop layer 120. In some embodiments, the dry etching process may be performed using first mask patterns 191 as etch masks. The first mask patterns 191 may include at least one of silicon oxide, silicon nitride, and silicon oxynitride.

In one embodiment, first recess regions 184 exposing the etch stop layer 120 may be formed between the first channel patterns 131 by the first patterning process. An interlayer insulating layer 195 may be formed to fill the first recess regions 184. The interlayer insulating layer 195 may include at least one of a silicon oxide layer, a silicon nitride layer, and a silicon oxynitride layer. The formation process of the interlayer insulating layer 195 may include a deposition process of an insulating layer and a planarization process of the insulating layer. Top surfaces of the first mask patterns 191 may be exposed by the planarization process.

Figure 20:
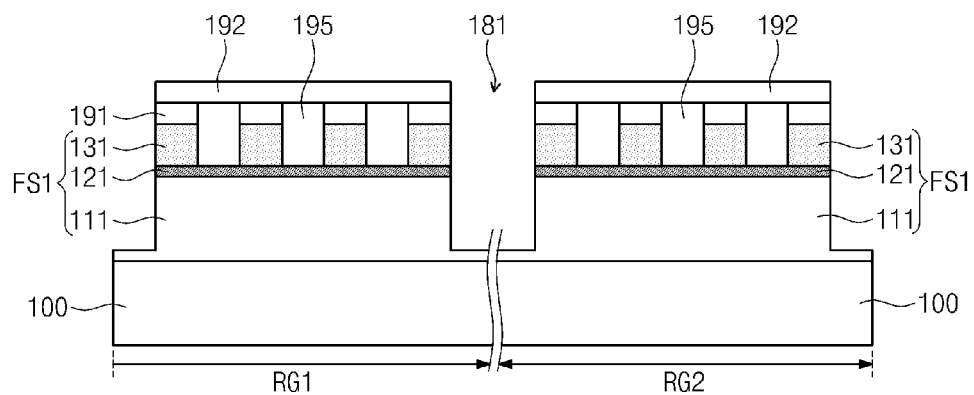

Referring to FIGS. 1 and 20, second mask patterns 192 may be formed on the first mask patterns 191. The second mask pattern 192 on the first region RG1 may be formed to cover the first channel patterns 131 disposed on the first region RG1, and the second mask pattern 192 on the second region RG2 may be formed to cover the first channel patterns 131 on the second region RG2. The second mask patterns 192 may include at least one of a silicon oxide layer, a silicon nitride layer, and a silicon oxynitride layer.

In one embodiment, a second patterning process may be performed using the second mask patterns 192 as etch masks to form trenches 181. As a result, the etch stop layer 120 may be etched to form etch stop patterns 121, and the first buffer layer 110 may be etched to form first buffer patterns 111. Thus, a first fin structure FS1 may be formed on each of the first region RG1 and the second region RG2. The first fin structure FS1 may include the first buffer pattern 111, the etch stop pattern 121 and the first channel patterns 131 that are sequentially stacked on each of the first and second regions RG1 and RG2. The second patterning process may include a dry etching process.

Figure 21:
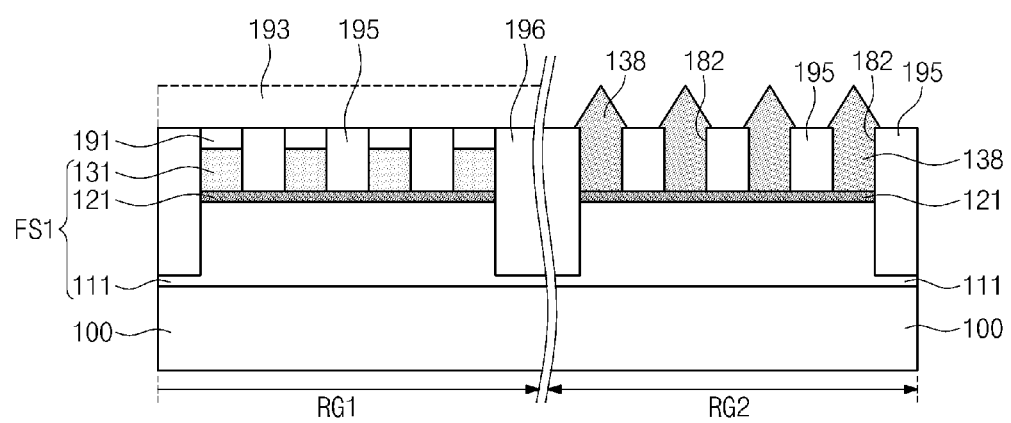

Referring to FIGS. 1 and 21, a device isolation layer 196 may be formed to fill the trenches 181. In some embodiments, an insulating layer may be formed to fill the trenches 181 and then a planarization process may be performed on the insulating layer until the first mask patterns 191 are exposed, thereby forming the device isolation layer 196. As a result, the second mask patterns 192 may be removed. In some embodiments, the device isolation layer 196 may include at least one of a silicon oxide layer, a silicon nitride layer, and a silicon oxynitride layer.

After the second mask patterns 192 are removed, a third mask pattern 193 may be formed to cover the first region RG1 and to expose the second region RG2. For example, the third mask pattern 193 may include at least one of a silicon oxide layer, a silicon nitride layer, and a silicon oxynitride layer. The first mask patterns 191 and the first channel patterns 131 on the second region RG2 may be sequentially removed using the third mask pattern 193 as an etch mask. In some embodiments, the removal process of the first mask patterns 191 and the first channel patterns 131 on the second region RG2 may include a plurality of selective etching processes. As a result, second recess regions 182 may be formed to expose the etch stop pattern 121 disposed on the second region RG2. The second recess regions 182 may be defined by sidewalls of the interlayer insulating layer 195, sidewalls of the device isolation layer 196 and a top surface of the etch stop pattern 121.

Preliminary second channel patterns 138 may be formed to fill the second region regions 182, respectively. The formation process of the preliminary second channel patterns 138 may include a SEG process using the etch stop pattern 121 as a seed layer. In some embodiments, as illustrated in FIG. 21, the preliminary second channel patterns 138 may be over-grown such that top surfaces of the preliminary second channel patterns 138 may be higher than a top surface of the interlayer insulating layer 195. However, the inventive concepts are not limited thereto.

Figure 22:
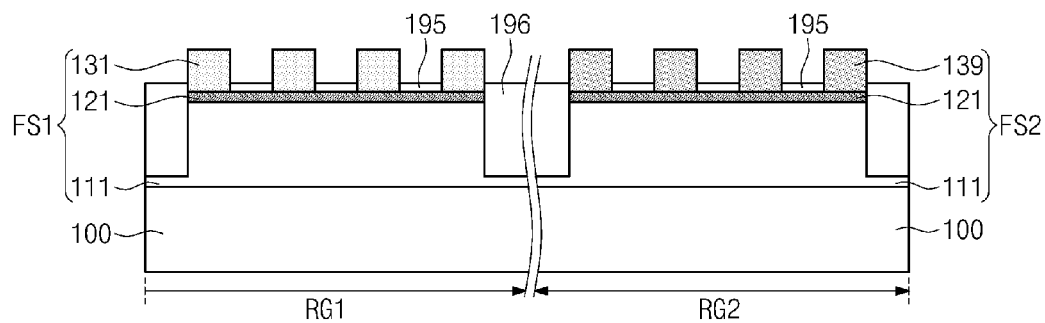

Referring to FIGS. 1 and 22, a planarization process may be performed until the first channel patterns 131 of the first region RG1 are exposed. As a result, second channel patterns 139 may be formed from the preliminary second channel patterns 138. Thus, a second fin structure FS2 may be formed on the second region RG2. The second fin structure FS2 may include the first buffer pattern 111, the etch stop pattern 121 and the second channel patterns 139 that are sequentially stacked on the second region RG2 of the substrate 100. In some embodiments, top surfaces of the second channel patterns 139 may be disposed at a substantially same level as top surfaces of the first channel patterns 131 of the first region RG1. An upper portion of the interlayer insulating layer 195 and an upper portion of the device isolation layer 196 may be etched to expose sidewalls of the first and second channel patterns 131 and 139. Top surfaces of the etched interlayer insulating layer 195 and the etched device isolation layer 196 may be higher than bottom surfaces of the first and second channel patterns 131 and 139 or may be lower than the bottom surfaces of the first and second channel patterns 131 and 139.

Figure 23:
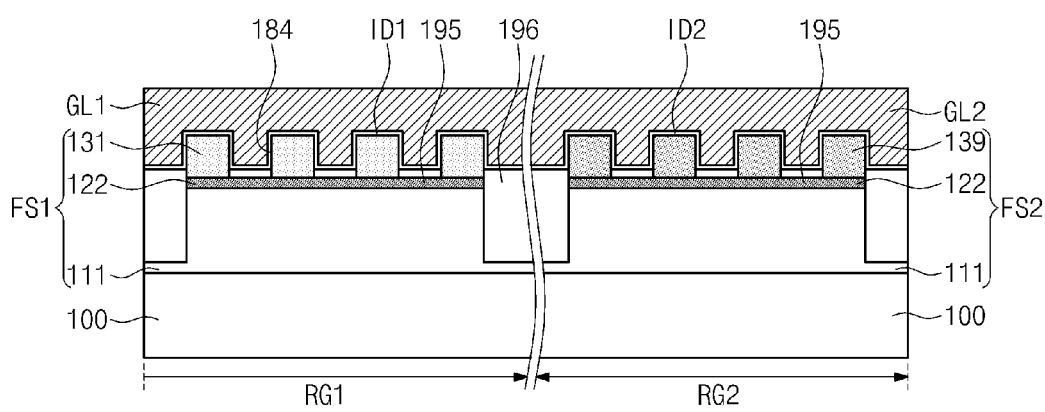

Referring to FIGS. 1 and 23, a first gate dielectric layer ID1 and a first gate electrode GL1 may be sequentially formed on the first region RG1, and a second gate dielectric layer ID2 and a second gate electrode GL2 may be sequentially formed on the second region RG2. Each of the first and second gate dielectric layers ID1 and ID2 may include silicon oxide. Alternatively, each of the first and second gate dielectric layers ID1 and ID2 may include a high-k dielectric material having a dielectric constant higher than that of silicon oxide. For example, each of the first and second gate dielectric layers ID1 and ID2 may include hafnium oxide ($HfO_2$), zirconium oxide ($ZrO_2$), or tantalum oxide ($Ta_2O_5$). Each of the first and second gate electrodes GL1 and GL2 may include a conductive material. For example, each of the first and second gate electrodes GL1 and GL2 may include at least one of doped silicon, a metal, and a conductive metal nitride (e.g., titanium nitride (TiN) and/or tantalum nitride (TaN)). A work function of the first gate electrode GL1 may be different from a work function of the second gate electrode GL2.

The first gate electrode GL1 may extend between a first source region S1 and a first drain region D1 on the first region RG1. The second gate electrode GL2 may extend between a second source region S2 and a second drain region D2 on the second region RG2. The first and second source regions S1 and S2 and the first and second drain regions D1 and D2 may be formed after the formation of the first and second gate electrodes GL1 and GL2. If the first region RG1 is the NMOSFET region and the second region RG2 is the PMOSFET region, the second source region S2 and the second drain region D2 may include a material having a lattice constant greater than that of the second channel patterns 139 of the second region RG2. In some embodiments, if the second channel patterns 139 are formed of silicon (Si), the second source region S2 and the second drain region D2 may be formed of silicon-germanium (SiGe). If the second source and drain regions S2 and D2 including the material having the relatively great lattice constant are formed to be in contact with the second channel patterns 139 having the relatively small lattice constant, lattices of the second source and drain regions S2 and D2 are compressed according to the second channel patterns 139. As a result, a compressive stress is generated in the second source region S2 and the second drain region D2. Thus, the second source region S2 and the second drain region D2 may apply the compressive stress to the second channel patterns 139 to improve mobility of carriers in the second channel patterns 139. On the contrary, the first source region S1 and the first drain region D1 may be formed of the same material as the first channel patterns 131. In some embodiments, if the first channel patterns 131 are formed of silicon, the first source region S1 and the first drain region D1 may be formed of silicon.

Figure 24:
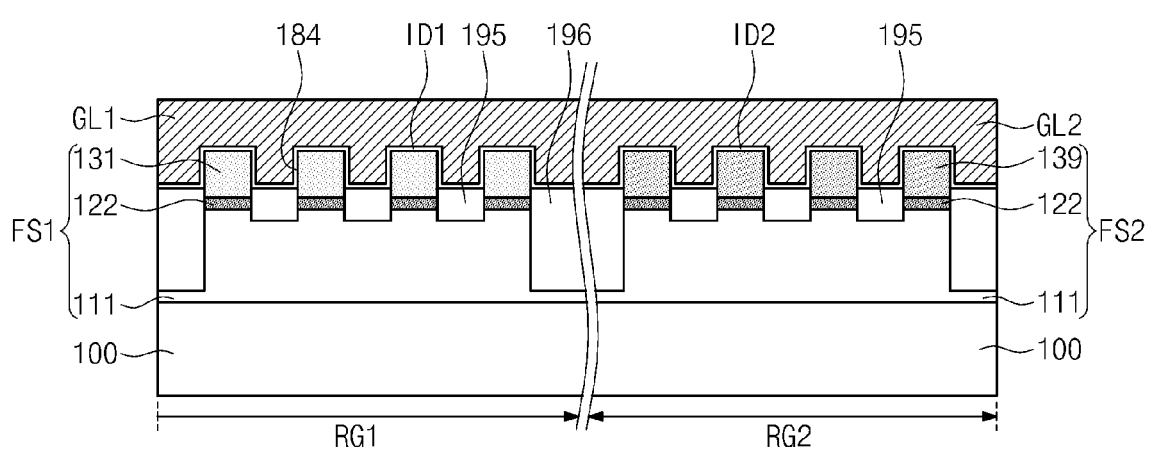
FIG. 24 is a cross-sectional view taken along a line A-A' of FIG. 1 to illustrate a semiconductor device according to yet still other embodiments.

FIG. 24 is a cross-sectional view taken along a line A-A' of FIG. 1 to illustrate a semiconductor device according to yet still other embodiments. In the present embodiment, the descriptions to the same elements as described in the above embodiments will be omitted or mentioned briefly for the purpose of ease and convenience in explanation.

In the present embodiment, an etch stop pattern 122 may be confinedly provided under each of the first and second channel patterns 131 and 139 and may not extend between the buffer patterns adjacent to each other. When the first recess regions 184 of FIG. 19 are formed, the etch stop layer 120 may be penetrated by over-etching, thereby forming the etch stop patterns 122 of the present embodiment. The interlayer insulating layer 195 formed in the first recess regions 184 may be connected to the first buffer pattern 111 between the etch stop patterns 122.

Figure 25:
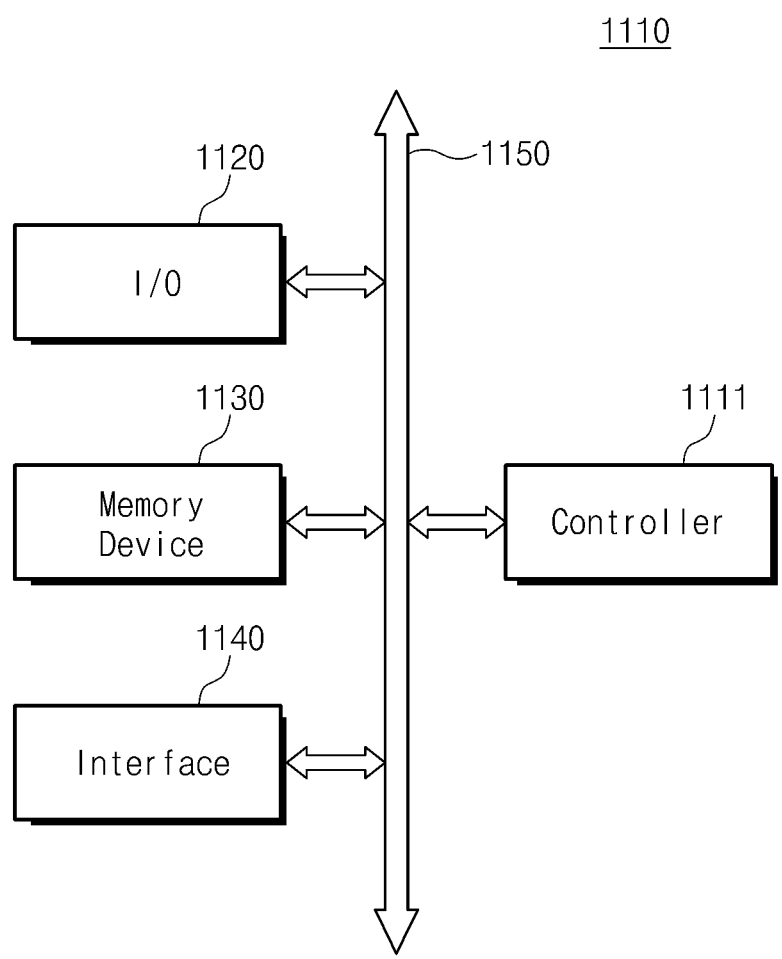
FIG. 25 is a schematic block diagram illustrating an electronic system including a semiconductor device according to certain embodiments.

FIG. 25 is a schematic block diagram illustrating an electronic system including a semiconductor device according to certain embodiments.

Referring to FIG. 25, an electronic system 1110 according to an embodiment of the inventive concept may include a controller 1111, an input/output (I/O) unit 1120, a memory device 1130, an interface unit 1140 and a data bus 1150. At least two of the controller 1111, the I/O unit 1120, the memory device 1130 and the interface unit 1140 may communicate with each other through the data bus 1150. The data bus 1150 may correspond to a path through which electrical signals are transmitted.

The controller 1111 may include at least one of a microprocessor, a digital signal processor, a microcontroller, or other logic devices having a similar function to any one of the microprocessor, the digital signal processor and the microcontroller. The I/O unit 1120 may include a keypad, a keyboard and/or a display unit. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1110 may further include a fast DRAM device and/or a fast SRAM device which acts as a cache memory for improving an operation of the controller 1110. At least one of the semiconductor devices according to the disclosed embodiments may be provided in the memory device 1130, the controller 1111, and/or the I/O unit 1120.

The electronic system 1110 may be applied to a personal digital assistant (PDA), a portable computer, a web tablet, a wireless phone, a mobile phone, a digital music player, a memory card or other electronic products. The other electronic products may receive or transmit information data by wireless.

The electronic system 1110 of FIG. 25 may be applied to electronic control devices of various electronic devices.

Figure 26:
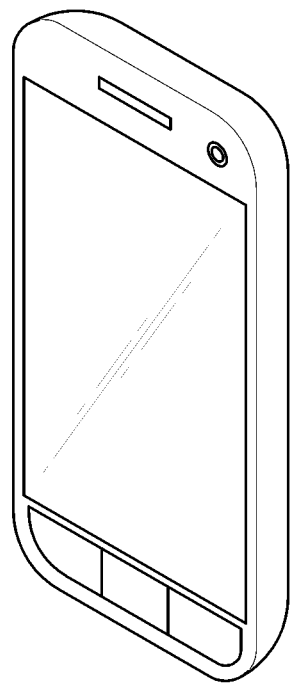
FIG. 26 is a mobile phone applied with an electronic system according to certain embodiments.

FIG. 26 illustrates a mobile phone 800 applied with the electronic system 1110 of FIG. 25 according to certain embodiments. In other embodiments, the electronic system 1110 of FIG. 25 may be applied to, for example, portable notebook computers, MP3 players, navigation devices, solid state disks (SSDs), cars, memory cards, or household appliances.

According to the disclosed embodiments, the semiconductor devices with the improved mobility characteristics may be provided. According to disclosed embodiments, the semiconductor devices with the reduced characteristic dispersion may be provided. According to the disclosed embodiments, the channel patterns may include germanium or the III-V group compound semiconductor, so that the CMOS structure requiring the channels having the high carrier mobility may be easily realized.

While the present disclosure has been described with reference to example embodiments, it will be apparent to those skilled in the art that various changes and modifications may be made without departing from the spirits and scopes of the disclosed embodiments. Therefore, it should be understood that the embodiments disclosed above are not limiting, but illustrative. Thus, the scopes of the inventive concepts are to be determined by the broadest permissible interpretation of the following claims and their equivalents, and shall not be restricted or limited by the foregoing description.

What is claimed is:

1. A fin field effect transistor comprising:
   a first fin structure and a second fin structure, each of the first and second fin structures protruding from a substrate;
   a first gate electrode on the first fin structure, and a second gate electrode on the second fin structure; and
   a gate dielectric layer between each of the first and second fin structures and the first and second gate electrodes, respectively,
   wherein each of the first and second fin structures comprises:

a buffer pattern including a first buffer pattern and a second buffer pattern that are sequentially stacked on the substrate;

a channel pattern on the buffer pattern; and an etch stop pattern between the channel pattern and the substrate, the etch stop pattern including a material having an etch resistivity greater than that of the buffer pattern, wherein the etch stop pattern is disposed between the first buffer pattern and the second buffer pattern, and wherein each of the first and second buffer patterns includes a semiconductor pattern.

2. The fin field effect transistor of claim 1, wherein the etch stop pattern includes a semiconductor material.

3. The fin field effect transistor of claim 1, wherein the channel pattern includes a plurality of channel components, and wherein the etch stop pattern extends between the plurality of channel components when viewed from a plan view.

4. The fin field effect transistor of claim 1, wherein the etch stop pattern is disposed between the first buffer pattern and the channel pattern.

5. The fin field effect transistor of claim 1, wherein the etch stop pattern is disposed between the second buffer pattern and the substrate.

6. The fin field effect transistor of claim 1, wherein the channel pattern of the first fin structure has a lattice constant different from that of the channel pattern of the second fin structure.

7. The fin field effect transistor of claim 6, wherein the first buffer pattern of the first fin structure is disposed below the etch stop pattern and the second buffer pattern of the first fin structure is disposed on the etch stop pattern, and wherein each of the first and second buffer patterns of the first fin structure has a lattice constant greater than that of the channel pattern of the first fin structure.

8. The fin field effect transistor of claim 6, wherein the first buffer pattern of the second fin structure is disposed below the etch stop pattern and the second buffer pattern of the second fin structure is disposed on the etch stop pattern, wherein the channel pattern of the second fin structure has a lattice constant greater than that of the second buffer pattern of the second fin structure, and wherein the second buffer pattern of the second fin structure has a lattice constant greater than that of the first buffer pattern of the second fin structure.

9. The fin field effect transistor of claim 1, wherein the gate dielectric layer are disposed on a top surface and sidewalls of the each channel pattern.

10. A semiconductor device comprising:

a first transistor and a second transistor respectively provided on a first region and a second region of a substrate, each of the first and second transistors including a fin structure, wherein each of the fin structures of the first and second transistors comprises:

a buffer component including a first buffer component and a second buffer component that are sequentially stacked on the substrate;

a channel component on the buffer component; and an etch stop component between the channel component and the substrate, wherein the channel component of the first transistor includes a different material from the channel component of the second transistor, wherein the etch stop component is disposed between the first buffet component and the second buffer component, and wherein each of the first and second buffer components includes a semiconductor component.

11. The semiconductor device of claim 10, wherein a lattice constant of the buffer component of the first transistor is greater than a lattice constant of the channel component of the first transistor, and wherein a lattice constant of the buffer component of the second transistor is smaller than a lattice constant of the channel component of the second transistor.

12. The semiconductor device of claim 10, wherein the buffer component of the first transistor includes a material having a lattice constant different from the buffer component of the second transistor.

13. The semiconductor device of claim 10, wherein each of the first and second transistors includes a plurality of fin structures, each including a corresponding channel component, and wherein, for each transistor, the etch stop component extends between the plurality of channel components when viewed from a plan view.

14. The semiconductor device of claim 13, wherein each of the first and second transistors further includes:

a gate electrode disposed on each channel component; and a gate dielectric layer between the each channel component and the gate electrode, wherein the gate electrode and the gate dielectric layer are further disposed on sidewalls of the each channel component.

15. The semiconductor device of claim 14, wherein the gate dielectric layer is further disposed on a top surface of the each channel component.

16. A method of forming a semiconductor device, the method comprising:

preparing a substrate including a first region and a second region;

forming a first fin structure on each of the first and second regions, the first fin structure on each region including a composite layer and a first channel pattern on the composite layer, and the composite layer including a buffer pattern and an etch stop pattern which are directly connected to each other;

forming a recess region to expose the etch stop pattern on the second region by removing at least a portion of the first fin structure disposed on the second region; and forming a second fin structure on the second region by forming a second channel pattern in the recess region.

17. The method of claim 16, wherein the buffer pattern is a first buffer pattern and a second buffer pattern sequentially disposed on the substrate, wherein the etch stop pattern is formed between the first buffer pattern and the second buffer pattern, and wherein forming the recess region comprises removing the first channel pattern and the second buffer pattern that are disposed on the second region.

18. The method of claim 16, wherein forming the second fin structure further comprises forming an additional buffer pattern between the second channel pattern and the etch stop pattern.

19. The method of claim 16, further comprising:

forming a pre-recess region penetrating at least a portion of the etch stop pattern on the first and second regions in order to form the first fin structure on the first and second regions.

20. The method of claim 16, further comprising:
forming a first gate electrode disposed on the first channel pattern, and a second gate electrode disposed on the second channel pattern; and
forming a gate dielectric layer between each of the first and second channel patterns and the first and second gate electrodes, respectively,
wherein each of the first and second gate electrodes and the gate dielectric layer are further disposed on sidewalls of each of the first and second channel patterns.

\* \* \* \* \*